(12) United States Patent
Wong et al.

(10) Patent No.: US 7,362,090 B2
(45) Date of Patent: Apr. 22, 2008

(54) AUTOMATED TRAY TRANSFER DEVICE FOR PREVENTION OF MIXING POST AND PRE-TEST DIES, AND METHOD OF USING SAME

(75) Inventors: Hon Meng Wong, Penang (MY); Lek Seng Lam, Penang (MY)

(73) Assignee: Intel Corporation, Santa Clara, CA (US)

( * ) Notice: Subject to any disclaimer, the term of this patent is extended or adjusted under 35 U.S.C. 154(b) by 34 days.

(21) Appl. No.: 11/093,661

(22) Filed: Mar. 30, 2005

(65) Prior Publication Data

US 2006/0226828 A1    Oct. 12, 2006

(51) Int. Cl.
*G01R 31/28* (2006.01)

(52) U.S. Cl. ................................. 324/158.1

(58) Field of Classification Search ........... 324/754, 324/761–762, 765, 760, 758, 158.1; 209/573–574, 209/552; 414/404, 416, 222.01, 222.08
See application file for complete search history.

(56) References Cited

U.S. PATENT DOCUMENTS

| | | | |
|---|---|---|---|
| 5,150,797 A | * | 9/1992 | Shibata ................. 209/573 |
| 5,565,008 A | * | 10/1996 | Shigetomo et al. ....... 29/25.01 |
| 6,066,822 A | * | 5/2000 | Nemoto et al. ............ 209/573 |
| 6,111,246 A | * | 8/2000 | Watanabe et al. ........ 250/222.1 |
| 6,339,321 B1 | * | 1/2002 | Yamashita et al. ....... 324/158.1 |
| 6,515,470 B2 | * | 2/2003 | Suzuki et al. ............ 324/158.1 |
| 2003/0020457 A1 | * | 1/2003 | Seng et al. .............. 324/158.1 |
| 2003/0128024 A1 | * | 7/2003 | Hwang et al. ........... 324/158.1 |
| 2004/0115981 A1 | * | 6/2004 | Wang ........................ 439/342 |
| 2004/0259402 A1 | * | 12/2004 | Lee ............................ 439/173 |

* cited by examiner

*Primary Examiner*—Ha Tran Nguyen
*Assistant Examiner*—Tung X. Nguyen
(74) *Attorney, Agent, or Firm*—Schwegman, Lundberg & Woessner, P.A.

(57) ABSTRACT

A method of sorting automated tray transfer trays includes detecting if a die remains in the tray. The method includes the ability to interrupt the automated tray transfer process to prevent mixing processed and unprocessed dice. An apparatus includes a sensor for detecting if a die remains in the tray. A sensor includes a protrusion on an automated tray transfer handler.

14 Claims, 6 Drawing Sheets

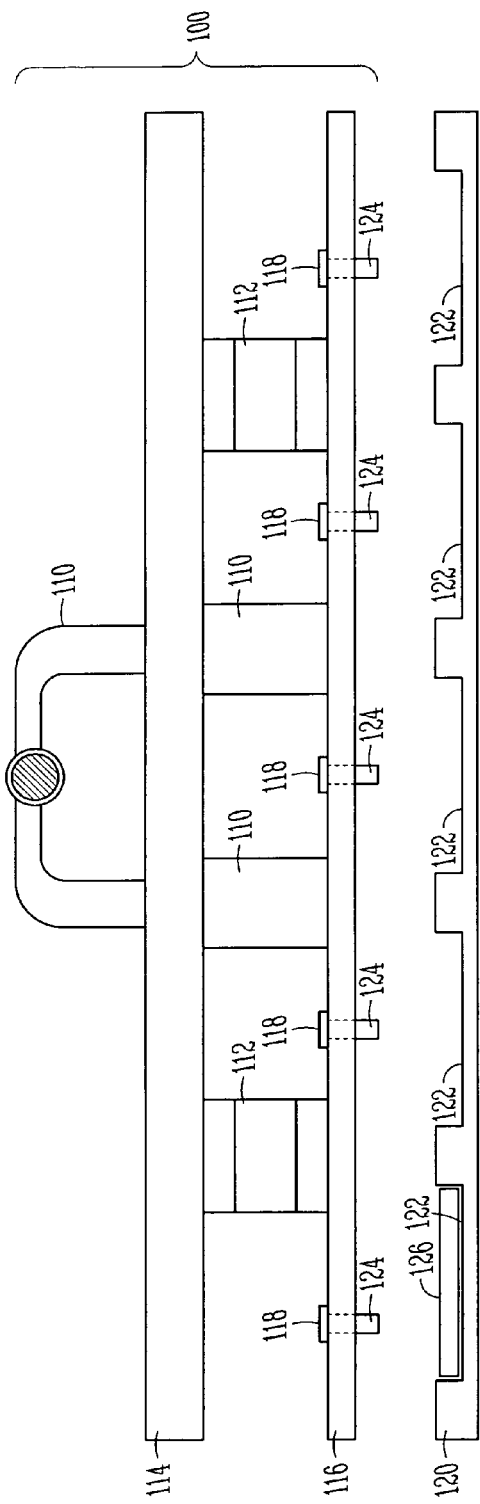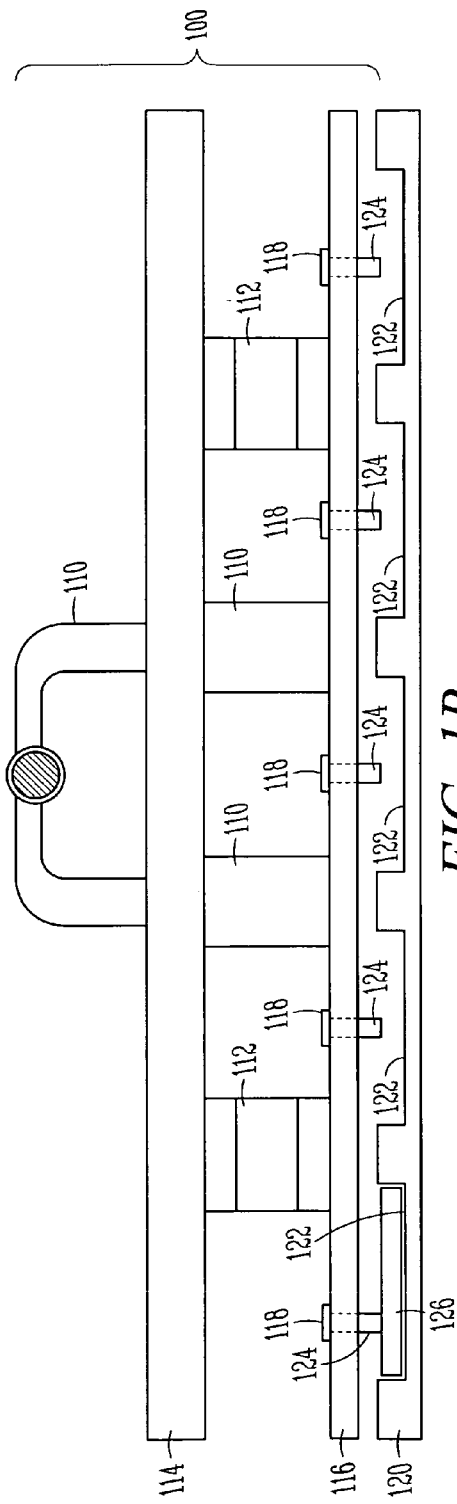

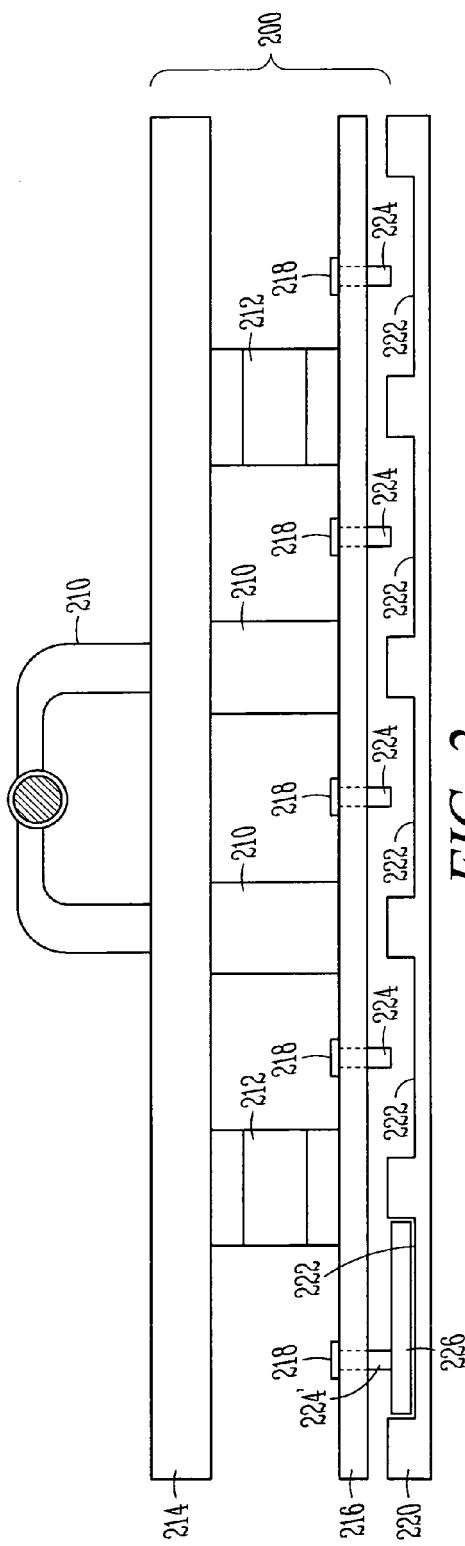
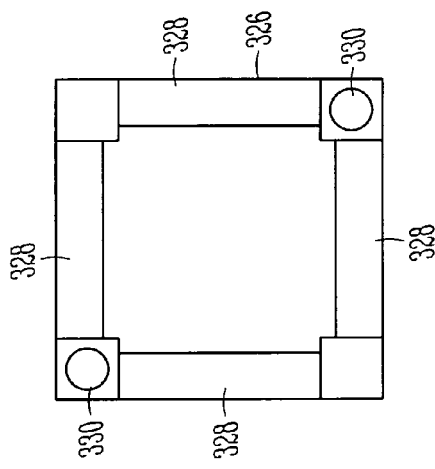

US 7,362,090 B2

AUTOMATED TRAY TRANSFER DEVICE FOR PREVENTION OF MIXING POST AND PRE-TEST DIES, AND METHOD OF USING SAME

TECHNICAL FIELD

Disclosed embodiments relate to an automated tray transfer (ATT) tray handler. More particularly, disclosed embodiments relate to a detection system that interrupts the ATT process if a die has been left in a die pocket of a tray.

BACKGROUND INFORMATION

During testing of microelectronic dice, the dice are moved by pick-and-place mechanisms and advanced to further processing. A plurality of dice is often tested in a die tray that includes several die pockets. After testing, the die tray is removed and stacked for further use with dice that are up-line from testing. Occasionally, a die is not removed from a die pocket of a die tray, and tested devices are stacked on top of untested devices, which can result in "escapees" of untested devices.

BRIEF DESCRIPTION OF THE DRAWINGS

In order to understand the manner in which embodiments are obtained, a more particular description of various embodiments briefly described above will be rendered by reference to the appended drawings. Understanding that these drawings depict only typical embodiments that are not necessarily drawn to scale and are not therefore to be considered to be limiting of its scope, some embodiments will be described and explained with additional specificity and detail through the use of the accompanying drawings in which:

FIG. 1A is a side elevation of an automated tray transfer (ATT) mechanism and a die tray, according to an embodiment;

FIG. 1B is a side cross section of the ATT mechanism depicted in FIG. 1A during further processing, according to an embodiment;

FIG. 2 is an elevational cross section of an ATT mechanism during processing, according to an embodiment;

FIG. 3 is a plan of a die with keep off zones (KOZs) and probe landing zones (PLZs), depicted according to an embodiment;

DETAILED DESCRIPTION

Figure 4:
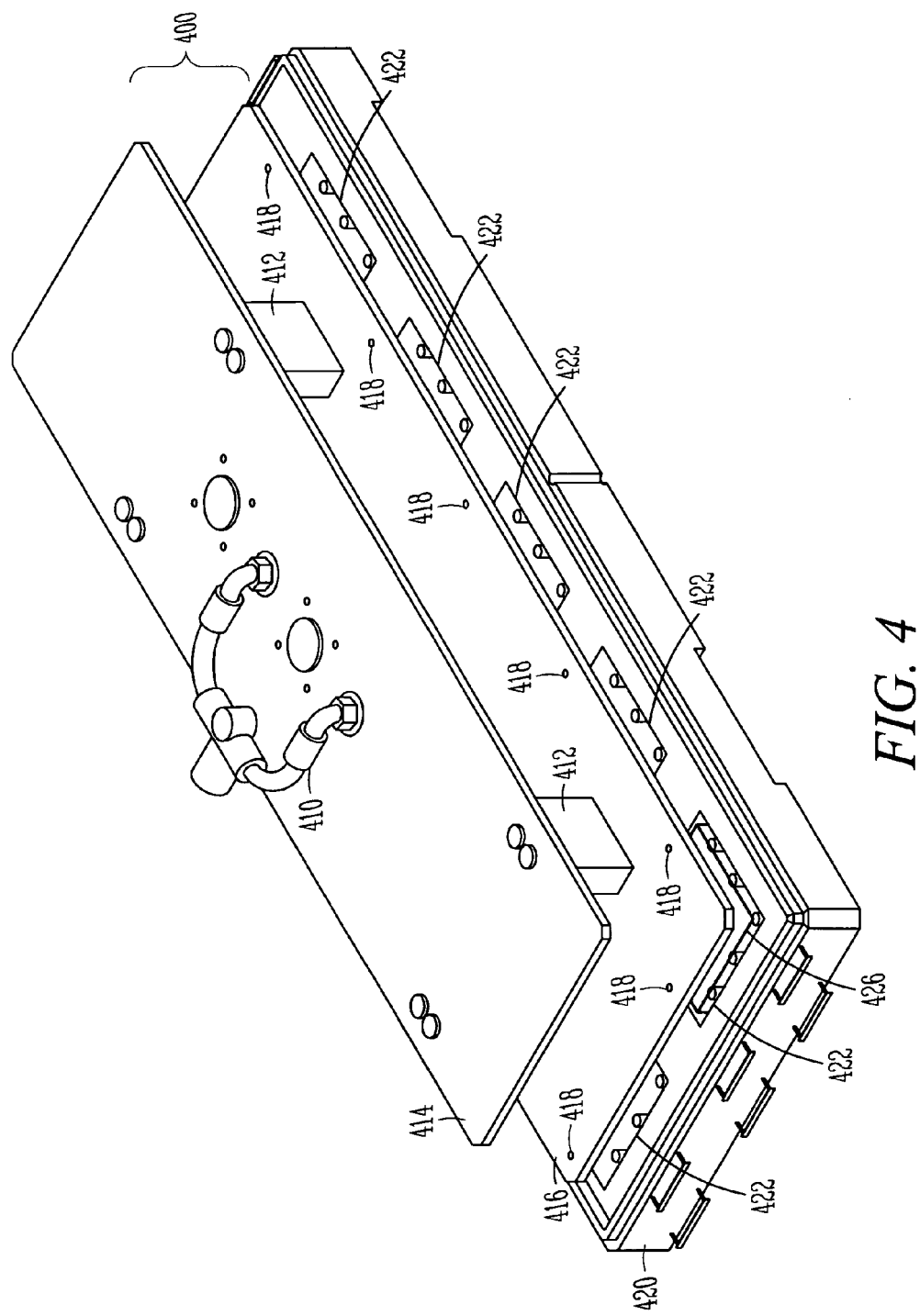
FIG. 4 is a perspective elevation of an ATT mechanism during processing with a die tray, according to an embodiment.

The following description includes terms, such as upper, lower, first, second, etc. that are used for descriptive purposes only and are not to be construed as limiting. The embodiments of a device or article described herein can be manufactured, used, or shipped in a number of positions and orientations. The terms "microelectronic device," "die," and "processor" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die.

Reference will now be made to the drawings wherein like structures will usually be provided with like reference designations. In order to show the structure and process embodiments most clearly, the drawings included herein are diagrammatic representations of embodiments. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

FIG. 1A is a side elevation of an automated tray transfer (ATT) mechanism 100 (also referred to as a "pickup head") and a die tray (also referred to as a "parts tray"), according to an embodiment. The ATT mechanism 100 includes a suction device 110 that is connectable to a pneumatic system. A spacer foot 112 is disposed between a top header bar 114 and a bottom foot bar 116. A plurality of probes 118 is disposed through the bottom foot bar 116 in preparation for determining whether an obstruction such as an unremoved die has been encountered. In an embodiment, each of the plurality of probes 118 is referred to as a sensor. In an embodiment, each of the plurality of probes 118 is replaced by an optical sensor. In an embodiment, each of the plurality of probes 118 is referred to as a mechanical sensor.

In addition to the ATT mechanism 100, a die tray 120 can be provided such that the ATT mechanism 100 is moved toward to the die tray 120. The ATT mechanism is alternatively referred to as a tray handler 100. A plurality of die pockets 122 is disposed within the die tray 120.

As the ATT mechanism 100 is moved toward the die tray 120, at least one protrusion such as a plurality of probe tips 124, each connected with a corresponding probe of the plurality of probes 118, is aligned to extend into the die pockets 122. In an embodiment, the each sensor includes a probe 118 and a probe tip 124. FIG. 1A depicts a residual die 126 that is an obstruction because it has not been removed from the die tray 120.

FIG. 1B is a side cross section of the ATT mechanism depicted in FIG. 1A during further processing, according to an embodiment. A given die pocket 122 of the die tray 120 depicts a residual die 126 such that the probe tip 124 of the probe 118 encounters the residual die 126 as an obstruction. According to an embodiment, where the probe tip 124 is immovable, a process jam occurs and an operator may be alerted in order to remove the residual die 126 such that it does not get mixed with dice that have a different test status from the residual die 126.

FIG. 2 is an elevational cross section of an ATT mechanism 200 during processing, according to an embodiment. The ATT mechanism 200 includes a suction device 210 that is connectable to a pneumatic system. A spacer foot 212 is disposed between a top header bar 214 and a bottom foot bar 216. A plurality of probes 218 are disposed through the bottom foot bar 216 in preparation for determining whether an obstruction such as an unremoved die has been encountered.

In addition to the ATT mechanism 100, a die tray 220 can be provided such that the ATT mechanism 100 is moved toward to the die tray 220. A plurality of die pockets 222 is disposed within the die tray 220. As the ATT mechanism 200 is moved toward the die tray 220, a plurality of probe tips 224, each connected with a corresponding the probes 218, is aligned to extend into the die pockets 222. FIG. 1A depicts a residual die 226 that has not been removed from the die tray 220.

In an embodiment where any of the probe tips 224 is sensitive such that it is movable, the residual die 226 and the site of its location in the die tray 220 within a given die pocket 222, is memorialized such as by an automated write statement to a database, such that detection of the obstruction is done by automation. Accordingly, a given probe tip 224' that encounters an obstruction that is the residual die 226, is distinguishable from the plurality of probe tips 224 that extend into respective die pockets 222 and that do not encounter obstructions.

According to an embodiment, if the probe is optionally not used to memorialize the die-pocket site, a process jam occurs and an operator may be alerted in order to remove the residual die 226.

Where the die-pocket site can be memorialized, according to an embodiment, and where the residual die 226 was part of a die lot that has already met the sample test criteria for this stage of the process, the process may continue by moving the die tray 220 with the ATT mechanism 200 by use of the suction device 210.

Where the sample test criteria for the residual die 226 has not been met, a process jam occurs and an operator may be alerted to remove the residual die 226.

FIG. 3 is a plan of a residual die 326 with keep off zones (KOZs) 328 and probe landing zones (PLZs) 330, depicted according to an embodiment. A KOZ is a region on a die surface that is to avoid any contact with a probe, which could damage the die in this region. A PLZ is a region on a die that can sustain a test probe touching it, which allows for probe testing of the die. Because each die has specific KOZs 328, it is useful to have the probe tip encounter the die in regions other than the KOZs 328. The residual die 326 depicts a probe tip landing pad 330 that allows for the probe tip to encounter the residual die 326 when it is an obstruction that is left within a die tray.

FIG. 4 is a perspective elevation of an ATT mechanism 400 during processing with a die tray 420, according to an embodiment. The ATT mechanism 400 includes a suction device 410 that is connectable to a pneumatic system. A spacer foot 412 is disposed between a top header bar 414 and a bottom foot bar 416. A plurality of probes 418 are disposed through the bottom foot bar 416 in preparation for determining whether an obstruction such as an unremoved die has been encountered.

In an embodiment in addition to the ATT mechanism 400, a die tray 420 is provided such that the ATT mechanism 400 is moved toward to the die tray 420. A plurality of die pockets 422 is disposed within the die tray 420. As the ATT mechanism 400 is moved toward the die tray 420, a plurality of probe tips 424 (see FIG. 5), each connected with the probes 418, is aligned to extend into the die pockets 422. FIG. 1A depicts a residual die 426 that has not been removed from the die tray 420.

Figure 5:
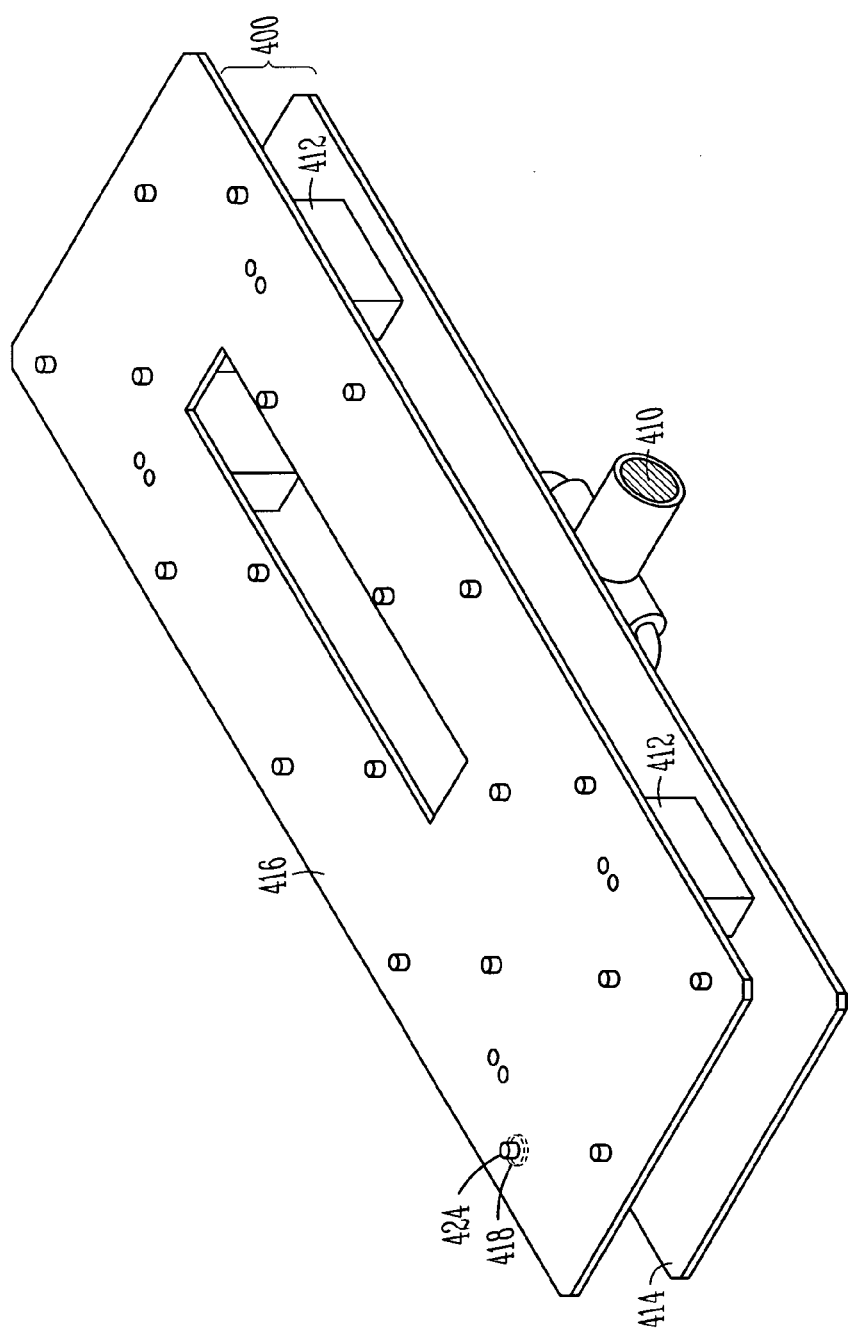
FIG. 5 is a perspective elevation of the ATT mechanism depicted in FIG. 4 with the ATT mechanism inverted.

FIG. 5 is a perspective elevation of the ATT mechanism 400 depicted in FIG. 4 with the ATT mechanism inverted. Accordingly, the suction device 410 is at the nethermost location of the ATT mechanism 400 as depicted. The plurality of probe tips are provided as two probe tips per corresponding die pocket of a 10-die pocket die tray, one of which is designated by the reference numeral 424. The spacer foot 412 is disposed between the top header bar 414 and the bottom foot bar 416. The plurality of probes 418 (depicted in phantom lines) is disposed through the bottom foot bar 416 in preparation for determining whether an obstruction has been encountered such as an unremoved die.

Figure 6:
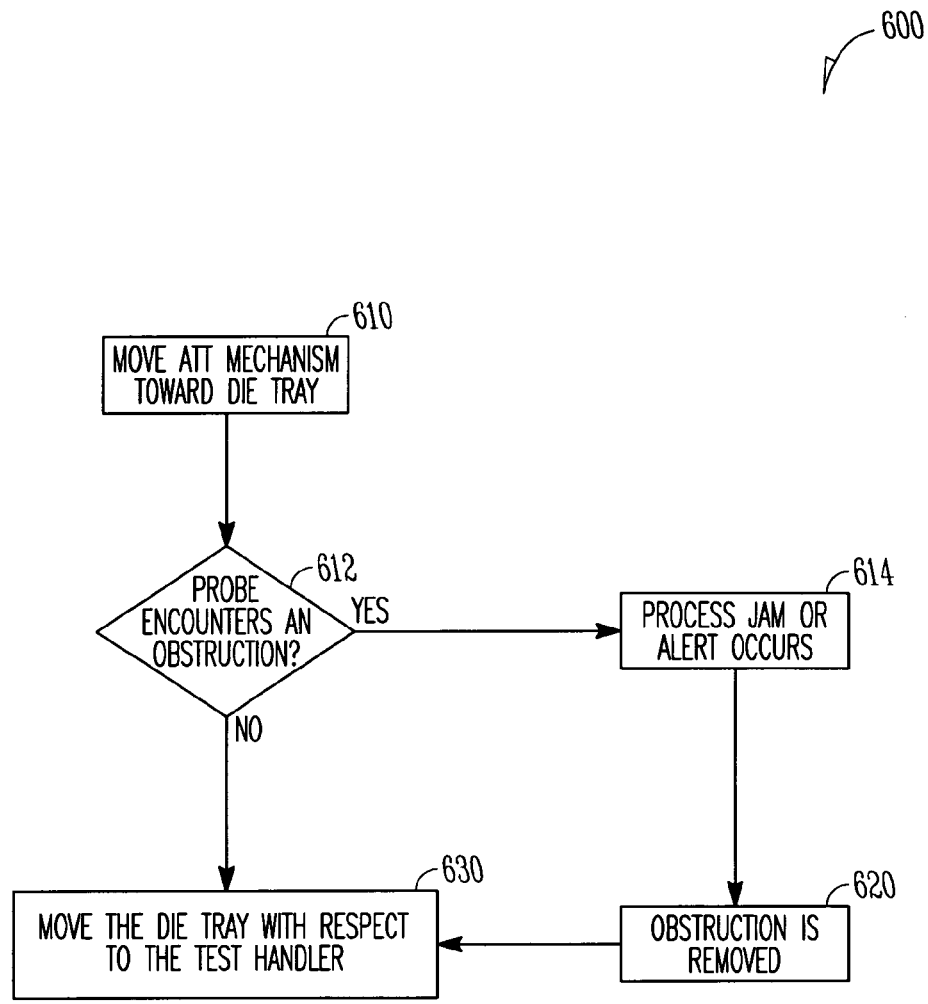
FIG. 6 is a method flow decision diagram according to various embodiments.

FIG. 6 is a method flow decision diagram 600 according to various embodiments.

At 610, the method includes moving the ATT mechanism toward a die tray.

At 612, the method includes a query whether the probe encounters an obstruction. If an obstruction is encountered, a process jam and/or an operator alert occurs at 614. Accordingly, an operator may be alerted in order to locate the obstruction, particularly if the obstruction is a microelectronic die.

At 620, the method includes removing the obstruction from the die tray. In an embodiment, the method includes an operator being the agent who removes the obstruction. In an embodiment, the obstruction is a die.

At 630, the method includes moving the die tray with respect to the location of the test handler.

Figure 7:
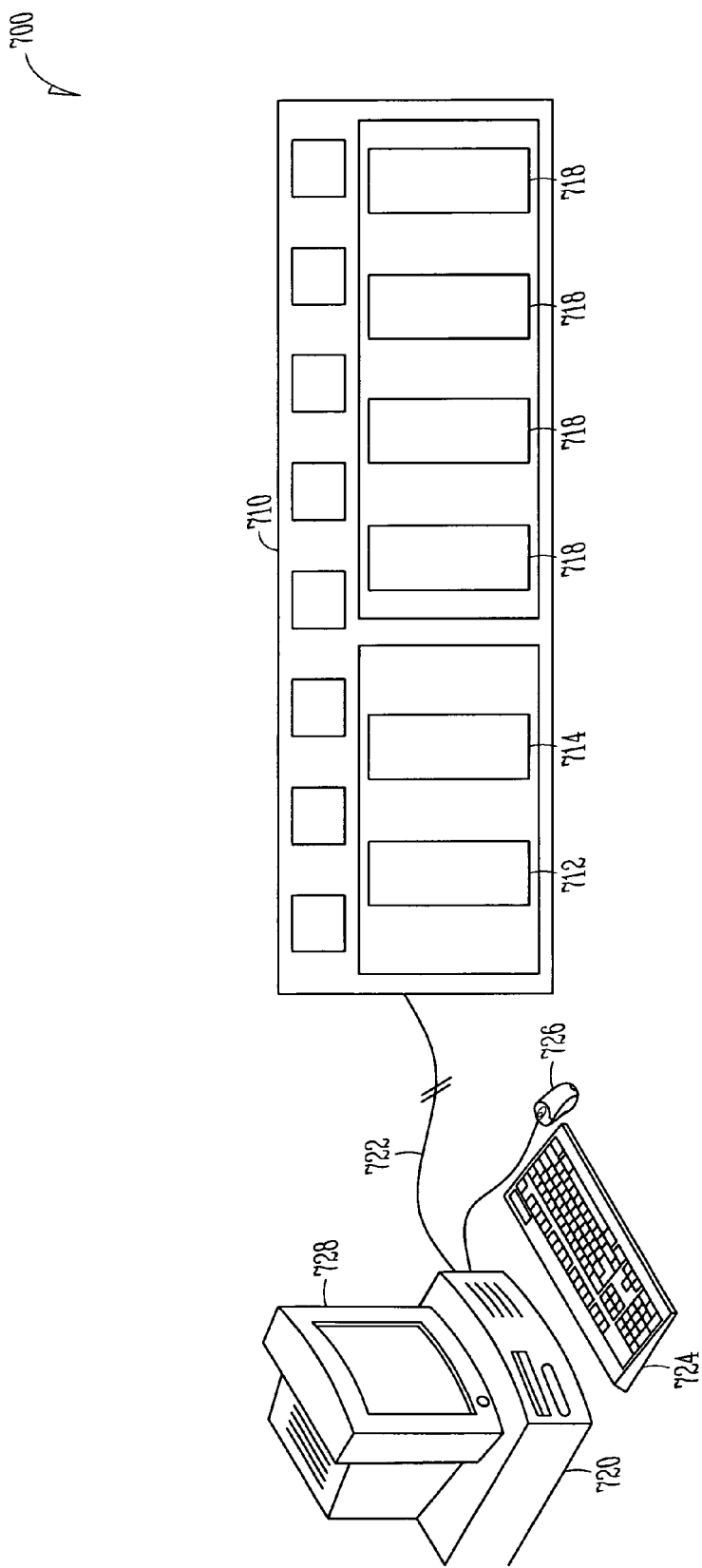
FIG. 7 is a schematic depiction of an ATT system, according to an embodiment.

FIG. 7 is a schematic depiction of an ATT system 700, according to an embodiment. The system 700 according to an embodiment includes a device such as a reliable-fast-small (RFS®) test handler 710, manufactured by Delta Design, of San Diego, Calif., that includes an input auto tray lift 712, an auto tray buffer 714, a plurality of sort auto tray lifts 716, and a dump 718. In an embodiment, a computing system 720 is a device such as a desktop computer that is electrically coupled 722 to the RFS test handler 710. The computing system 720 can include input mechanisms such as a keyboard 724 and a mouse 726 and an output device such as a monitor 728.

In an embodiment, the ATT mechanism is referred to as a tray handler. Accordingly, the tray handler is coupled with a die tray that includes a die pocket. A sensor on the tray handler is a device such as the probe and/or the probe tip as set forth in this disclosure. Accordingly, the probe tip may be a protrusion that is extendable into a die pocket of a tray if the die pocket is devoid of an obstruction, but the sensor may also be an optical sensor that similarly detects whether a die pocket of a die tray is devoid of an obstruction.

Where the sensor is a protrusion, such as a probe tip, the tray handler is configured to include the protrusions being aligned away from a KOZ of a die that is placeable as the obstruction in the die pocket. In an embodiment, the die pocket is part of a plurality of 10 die pockets and accordingly, the protrusion is part of a plurality of 20 probe tips as set forth in this disclosure. Similarly according to an embodiment, where the die pocket is part of a plurality of n die pockets, the protrusion is part of a plurality of 2n protrusions, and each die pocket of the plurality of n die pockets corresponds to two protrusions of the plurality of 2n protrusions.

The Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An apparatus comprising:
    a tray handler including a suction device, wherein the tray handler is coupleable by the suction device with a die tray with a die pocket; and
    a sensor on the tray handler, wherein the sensor detects whether the die pocket contains a residual die, and wherein the sensor includes a protrusion that is extendable into a die pocket of a die tray if the die pocket is devoid of a residual die.

2. The apparatus of claim 1, further including a die tray with a die pocket.

3. The apparatus of claim 1, further including a die tray with a plurality of die pockets.

4. The apparatus of claim 1, wherein the sensor facilitates memorializing a die-pocket location that corresponds to the residual die.

5. An apparatus comprising:
    a tray handler including a suction device, wherein the tray handler is coupleable by the suction device with a die tray with a die pocket;
    a die tray with a die pocket; and
    a sensor on the tray handler, wherein the sensor detects whether the die pocket contains a residual die, wherein the sensor includes a protrusion that is extendable into a die pocket of a tray if the die pocket is devoid of a residual die, and wherein the protrusion is disposed on the tray handler at a location that is aligned away from a keep-out zone of a die that is placeable as an obstruction in the die pocket.

6. The apparatus of claim 5, wherein the die pocket is part of a plurality of die pockets of a die tray, and wherein the protrusion is part of a plurality of protrusions.

7. The apparatus of claim 5, wherein the die pocket is part of a plurality of die pockets of a die tray, wherein the protrusion is part of a plurality of protrusions, and wherein each die pocket of the plurality of die pockets in the die tray corresponds to a protrusion of the plurality of protrusions.

8. An apparatus comprising:
    a tray handler including a suction device, wherein the tray handler is coupleable by the suction device with a die tray with a die pocket;
    a die tray with a die pocket; and
    a sensor on the tray handler, wherein the sensor detects whether the die pocket contains a residual die, wherein the sensor includes a protrusion that is extendable into the die pocket of a die tray if the die pocket is devoid of a residual die wherein the die pocket is part of a plurality of n die pockets, wherein the protrusion is part of a plurality of $2n$ protrusions, and wherein each die pocket of the plurality of n die pockets in the die tray corresponds to two protrusions of the plurality of $2n$ protrusions.

9. The apparatus of claim 8, wherein the sensor facilitates memorializing a die-pocket location that corresponds to the residual die.

10. The apparatus of claim 8, wherein the sensor facilitates memorializing a die-pocket location that corresponds to the residual die, and wherein memorializing includes electronic storage of the die-pocket location.

11. The apparatus of claim 8, further including a die tray with a plurality of die pockets.

12. An apparatus comprising:
    a tray handler including a suction device, wherein the tray handler is coupleable by the suction device with a die tray with a die pocket;
    a die tray with a die pocket; and
    a sensor on the tray handler, wherein the sensor detects whether the die pocket contains a residual die, wherein the sensor includes a plurality of protrusions that are extendable into the die pocket of a die tray if the die pocket is devoid of a residual die, and wherein the sensor facilitates memorializing a die-pocket location that corresponds to the residual die, and wherein memorializing includes electronic storage in a personal computer of the die-pocket location.

13. The apparatus of claim 12, further including a die tray with a plurality of die pockets.

14. The apparatus of claim 12, wherein the die pocket is part of a plurality of die pockets of a die tray, wherein the protrusion is part of a plurality of protrusions, and wherein each die pocket of the plurality of die pockets in the die tray corresponds to a protrusion of the plurality of protrusions.

* * * * *